United States Patent [19]
Shimizu et al.

[11] Patent Number: 6,038,049
[45] Date of Patent: Mar. 14, 2000

[54] WAVEFORM-SHAPING CIRCUIT AND A DATA-TRANSMITTING APPARATUS USING SUCH A CIRCUIT

[75] Inventors: Takayuki Shimizu, Kitakatsuragi-gun; Naruichi Yokogawa, Kashihara, both of Japan

[73] Assignee: Sharp Kabushiki Kaisha, Osaka, Japan

[21] Appl. No.: 08/971,717

[22] Filed: Nov. 17, 1997

[30] Foreign Application Priority Data

Nov. 25, 1996 [JP] Japan ................................ 8-313862

[51] Int. Cl.$^7$ ................................................. H04B 10/06
[52] U.S. Cl. ...................... 359/189; 250/214 A; 375/317
[58] Field of Search .................................. 359/189, 154, 359/162; 250/214 A; 375/317

[56] References Cited

U.S. PATENT DOCUMENTS

| | | | |
|---|---|---|---|
| 5,612,810 | 3/1997 | Inami et al. | 359/189 |
| 5,644,127 | 7/1997 | Ohmae | 250/231.16 |

FOREIGN PATENT DOCUMENTS

| | | |
|---|---|---|
| 0 489 927 A1 | 6/1992 | European Pat. Off. . |
| 0 526 841 A1 | 2/1993 | European Pat. Off. . |
| 0 624 009 A1 | 11/1994 | European Pat. Off. . |
| 05 227104 | 9/1993 | Japan . |
| 07 106928 | 4/1995 | Japan . |
| 07 231307 | 8/1995 | Japan . |
| 7-303051 | 11/1995 | Japan . |

OTHER PUBLICATIONS

Copy of Communication dated Nov. 17, 1998, issued by the European Patent Office re corresponding EPA No. 97309327.1 (3 pages).

*Primary Examiner*—Kinfe-Michael Negash
*Attorney, Agent, or Firm*—Dike, Bronstein, Roberts & Cushman, LLP; David G. Conlin

[57] ABSTRACT

In an infrared data-receiving circuit wherein an output electric current of a photodiode is current-to-voltage converted by a preamplifier and, after having been amplified by an amplification circuit, is subjected to a waveform-shaping operation in a comparator by using a predetermined threshold value, the threshold voltage, upon receipt of a low signal voltage, is set at the average value Vav that has been formed by two LPFs and, upon receipt of a high signal voltage, is also set at a shift value that has been obtained by allowing the voltage, which has been generated by shifting of a level shift circuit, to be sampled by a peak-hold circuit constituted of a differential amplifier. Thus, the apparatus is allowed to deal with a wide dynamic range. Moreover, in this arrangement, a single capacitor may be commonly used for an integrating operation in the LPFs and for a holding operation in the peak-hold circuit so as to provide a simple construction that is preferably applied to an integrated circuit. Consequently, in the infrared data-receiving circuit that uses the output from the photodiode by subjecting it to the waveform-shaping operation, it becomes possible to deal with a wide range of level differences by using a simple construction.

9 Claims, 13 Drawing Sheets

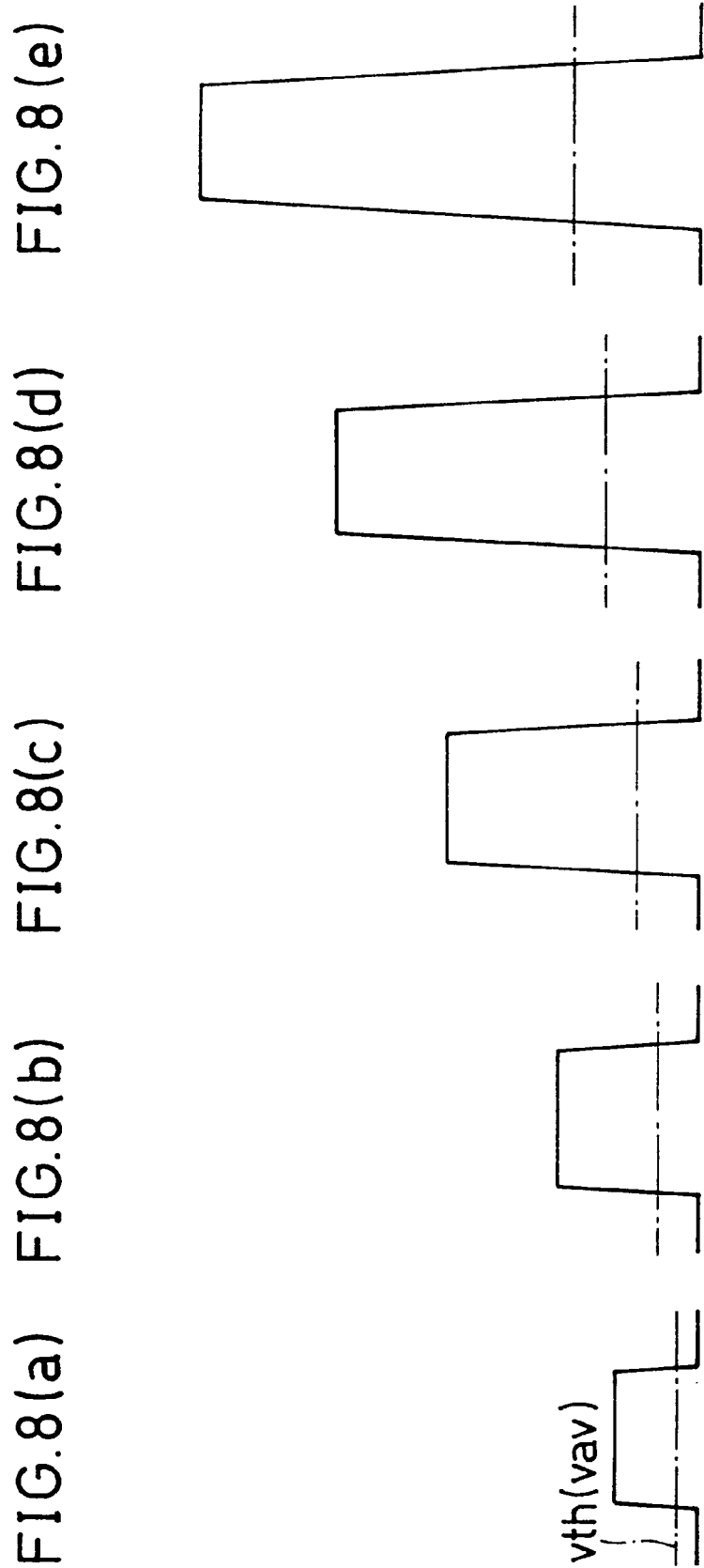

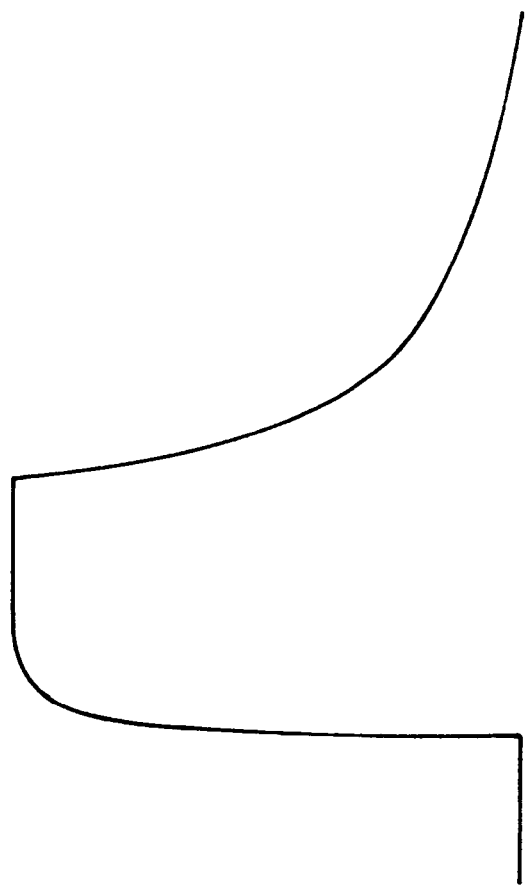
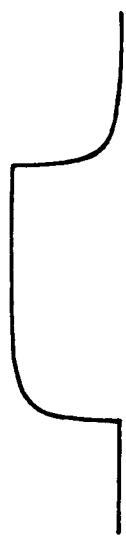

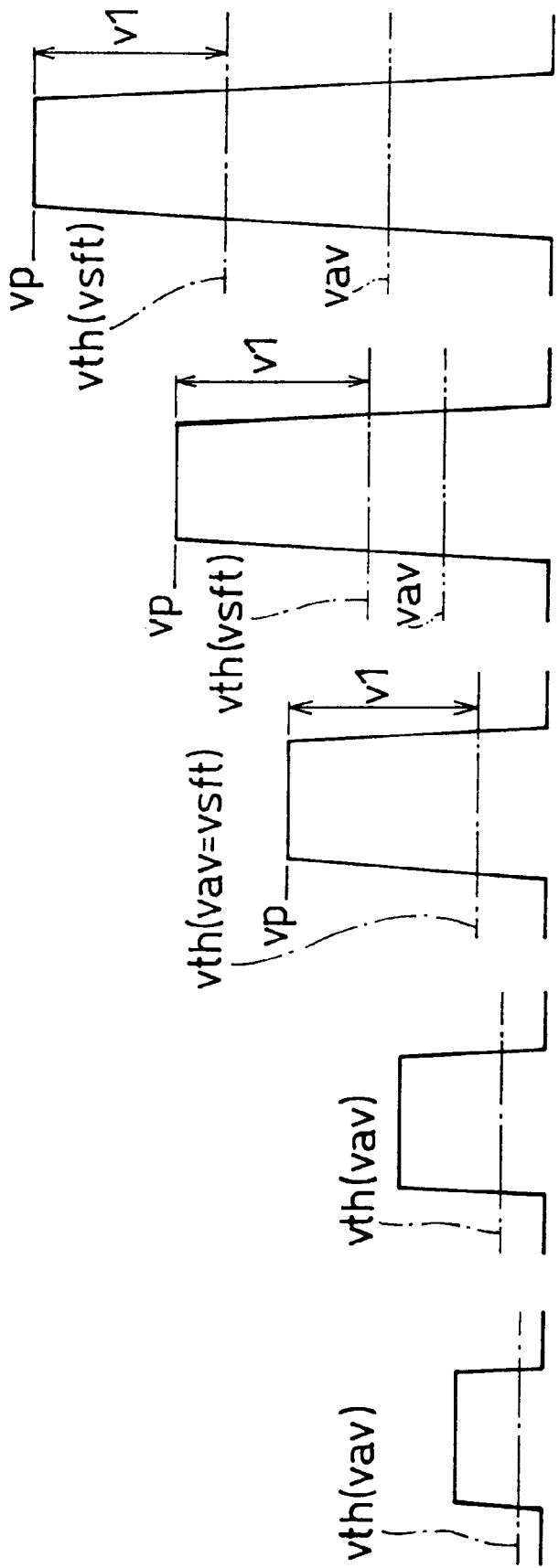

WAVEFORM-SHAPING CIRCUIT AND A DATA-TRANSMITTING APPARATUS USING SUCH A CIRCUIT

FIELD OF THE INVENTION

The present invention relates to a waveform-shaping circuit for discriminating the level of an input signal using a predetermined threshold value and shaping it into a pulse with a rectangular waveform, and also concerns an apparatus, such as a portable information terminal, for carrying out infrared data communications by using such a circuit.

BACKGROUND OF THE INVENTION

FIG. 7 is a block diagram showing a schematic construction of a typical conventional infrared data-receiving circuit 1. This infrared data-receiving circuit 1 is installed in an apparatus such as a portable information terminal, and used for receiving infrared data that matches the standard of IrDA (Infrared Data Association) 1.0.

A supply voltage Vcc is applied to the cathode side of the photodiode 2, and the photodiode 2 outputs a photocurrent corresponding to the intensity of infrared light that has been received from the anode to the preamplifier 3. The preamplifier 3 converts the photocurrent to a voltage, and the output is inputted to the non-inversion input terminal of the amplification circuit 5 through the coupling capacitor 4. The inversion input terminal of the amplification circuit 5 is connected to ground through the coupling capacitor 6, and the non-inversion input terminal and the inversion input terminal are respectively maintained at a predetermined dc-input level of the amplification circuit 5 by pull-up resistors 7 and 8.

The signal voltage vsig from the amplification circuit 5 is directly inputted to the inversion input terminal of the comparator 11 for carrying out a waveform-shaping operation, and also inputted to low-pass filter 12 on the first stage. The output of low-pass filter 12 is inputted to low-pass filter 14 on the second stage through the buffer 13. Low-pass filter 14 is constituted by an integrator having a capacitor 15, and each of these low-pass filters 12 and 14 integrates the signal voltage vsig to find the average value vav, and outputs it to the non-inversion input terminal of the comparator 11 as the threshold voltage vth. The comparator 11 sets the output signal vo to the output terminal 16 at low level when the signal voltage vsig is not less than the threshold voltage vth.

Therefore, supposing that the unit cycle is T with the pulse duty of, for example, T/4, and that the peak value of the pulse is vp, the threshold voltage vth is vp/4, and as illustrated in FIG. 8(a)–FIG. 8(b)–FIG. 8(c), the higher the signal voltage vsig becomes, the greater the threshold value vth increases. Thus, the pulse width of the rectangular pulse, which is formed by discriminating the level using the threshold value vth, is always made virtually constant.

In the infrared data-receiving circuit 1 having the above-mentioned arrangement, supposing that the limited communication range is, for example, 1 (m), the output current of the photodiode 2 at the limited communication range is, for example, several hundreds (nA); in contrast, the output current at close-range communication is, for example, several tens (mA). This requires that the infrared data-receiving circuit 1 should have a dynamic range of nearly one hundred (dB).

Further, although the photodiode 2 is not required to be so highly-sensitive in the case of the transmission of the infrared light through optical fibers and therefore, has pulses having fast pulse rises and falls, it is required to be highly-sensitive in the case of the spatial transmission of the infrared light, and upon receipt of a high input, the fall of the photocurrent becomes slow, thereby resulting in a problem of tailing. In other words, the photocurrent has the waveform shown in FIG. 9(a) at the time of intermediate-range communication; however, it comes to have the waveform shown in FIG. 9(b) at the time of close-range communication, resulting in a problem of rounded waveforms in falling.

Therefore, when the threshold voltage vth of the comparator 11 is maintained at the average value vav of the signal voltage vsig from the amplification circuit 5 regardless of the intensity of the inputted infrared light, the pulse width of the output signal vo tends to become quite larger than the actual pulse width upon close-range communication. In this manner, great irregularities occur in the output pulse width depending on the communication range, resulting in a problem of limitation of the communication range.

In this respect, the aforementioned IrDA1.0 system has a maximum data-transfer speed of 115 (kbps), and supposing that the unit cycle is T, the transmitting pulse width is 3T/16; therefore, even if it expands not less than three fold, the transmitting pulse can be reproduced.

However, in the IrDA1.1 standard as shown in FIG. 10, since the maximum data-transfer speed is as high as 4 (Mbps), and since the quaternary PPM (Pulse Position Modulation) is used, high precision is required for the output pulse width. This raises a problem in which the above-mentioned infrared data- receiving circuit 1 is not applicable.

FIG. 11 shows a block diagram of another prior-art infrared data-receiving circuit 21. Since this infrared data-receiving circuit 21 is similar to the aforementioned infrared data-receiving circuit 1, the corresponding parts thereof are indicated by the same reference numerals and the description thereof is omitted. In the infrared data-receiving circuit 21, the signal voltage vsig from the amplification circuit 5 is inputted to the level-detection circuit 22 so that its peak value vp is detected. In response to the results of detection of the level-detection circuit 22, the threshold-value voltage generation circuit 23 forms a shift value vsft that is lower than the peak value vp by a predetermined voltage v1 as the threshold value voltage vth, and outputs it to the non-inversion input terminal of the comparator 11.

Thus, the threshold-value voltage vth is allowed to vary in accordance with the peak value vp; thus, different from the aforementioned infrared data-receiving circuit 1, it becomes possible to generate a pulse for the output signal vo without being adversely affected by tailing upon receipt of a high input.

However, even in the infrared data-receiving circuit 21 shown in FIG. 11, although it reproduces a comparatively accurate pulse upon close-range communication, it cannot maintain the aforementioned predetermined voltage v1 upon intermediate-range communication, thereby failing to form the threshold-voltage value vth.

Therefore, an infrared data-receiving circuit 31 as shown in FIG. 12, which is modified so as to incorporate the features of the aforementioned infrared data-receiving circuits 1 and 21, has been proposed. Here, since the infrared data-receiving circuit 31 is similar to the aforementioned infrared data-receiving circuits 1 and 21, the corresponding parts are indicated by the same reference numerals.

In the infrared data-receiving circuit 31, after the signal voltage vsig from the amplification circuit 5 has been reduced by the predetermined voltage v1, that is, for example, by 300 (mV), in the level-shift circuit 32, its peak value vp is sampled by the peak-hold circuit 33, and then the result of holding is inputted to the comparison circuit 35 through the buffer 34 as a shift value vsft.

Moreover, the signal voltage vsig is inputted to the comparison circuit 35 as the average value vav through the first low-pass filter 12 and the buffer 13 as well as the second low-pass filter 14 and the buffer 40. The comparison circuit 35 outputs the higher of the two levels of the shift value vsft and the average value vav to the non-inversion input terminal of the comparator 11 as the threshold-value voltage vth.

Therefore, as shown in FIGS. 13(a), 13(b) and 13(c), the threshold voltage vth becomes the average value vav when the signal voltage vsig is comparatively low; and as shown in FIGS. 13(d) and 13(e), it becomes the shift value vsft when the average value vav becomes smaller than the value that is reduced from the peak value vp by the predetermined value v1, that is, when the signal voltage vsig is comparatively high.

In the aforementioned IrDA1.1 system, since the data-transfer speed is 4 (Mbps) as described earlier and since the duty per unit cycle T is a ¼ as shown FIG. 10, the pulse width is 125 (nsec). Therefore, the aforementioned average vav is ¼ of the peak value vp of the signal voltage vsig. Further, when v1=300 (mV) holds, as described earlier, the value h, which allows the threshold value vth to switch from the average value vav to the shift value vsft, satisfies the following relationship:

$$h/4 = 300 \text{ (mV)} \tag{1}$$

By allowing the threshold value vth to conform to the input signal level, it becomes possible to eliminate the aforementioned adverse effects due to tailing in the photodiode 2 as shown in FIG. 9(b), and consequently to make the pulse width of a pulse that has been discriminated and shaped by the threshold voltage vth virtually constant.

The above-mentioned infrared data-receiving circuit 31 can reproduce the pulse width of the infrared pulse in a virtually accurate manner within a predetermined limited-range communication; however, such an infrared data-receiving circuit 31 requires that the holding-use capacitor 38 and an integrating capacitor 15 installed in connection with the low-pass filter 14 should have sufficient capacities, for example, as large as 200 (pF). Consequently, to install many capacitors occupying such large areas raises a problem in construction of compactly integrated circuits.

SUMMARY OF THE INVENTION

The objective of the present invention is to provide a waveform-shaping circuit which, upon receipt of a pulse input having great level differences, releases a waveform that accurately reflects the pulse width with a simple construction, and also to provide an infrared data-transmitting apparatus using such a waveform-shaping circuit.

The waveform-shaping circuit of the present invention is designed so that the input signal is discriminated by using the higher of the two values, that is, a first threshold value that is selected as a peak value for a first signal that varies in response to an input signal and a second threshold value that is selected as the average of the input signal, in order to shape the waveforms. For this purpose, the waveform-shaping circuit, which has a peak-hold circuit for finding the peak value of the first signal and an average-value calculating circuit for finding the average of the input signal and which also has a common capacitor that is commonly used for a holding operation in the peak-hold circuit as well as for an integrating operation in the average-value calculation circuit, is characterized in that the direction of currents to be supplied to the capacitor in the peak-hold circuit and the average-value calculating circuit is limited only to a first direction and that the waveform-shaping circuit is further provided with a bypass circuit, installed in parallel with the capacitor, for allowing current to flow in a direction reversed to the first direction.

In this arrangement, since the output stages to the capacitor in the peak-hold circuit and the average-value calculating circuit contain elements for supplying only one-directional currents, such as diodes and transistors, only the current in the first direction is supplied to the capacitor so as to charge the capacitor. Further, the capacitor is allowed to discharge by the bypass circuit that is installed in parallel with the capacitor. Thus, the terminal voltage of the capacitor is set at the higher of the two values, that is, the peak value and the average value. Consequently, both the holding operation for the peak value and the integrating operation for the average-value calculation can be carried out by a single capacitor.

Therefore, in an arrangement which, upon receipt of a pulse input having a great level difference, can provide a waveform that accurately reflects the pulse width thereof by using two threshold values selectively, the same capacitor can be commonly used for a holding operation in the peak-hold circuit and for an integrating operation in the average-value calculating circuit. As a result, it becomes possible to simplify the apparatus by eliminating a capacitor, which is a large-size component, and a comparison circuit for the two threshold values.

Additionally, it is very difficult to integrate many large-capacity capacitors onto an integrated circuit. Therefore, the waveform-shaping circuit, which eliminates the number of capacitors, is easily integrated onto an integrated circuit, and consequently is very effective.

Moreover, in addition to the above-mentioned arrangement, the waveform-shaping circuit is preferably provided with an amplifier for amplifying the input signal so as to generate an inverted output and a non-inverted output, a level-shift circuit for reducing the level of the non-inverted output by a predetermined level, and a voltage divider for voltage-dividing the difference between the output of the level-shift circuit and the inverted output by a predetermined ratio so as to output the resulting signal to the peak-hold circuit as the first signal.

With this arrangement, the voltage divider, which is constituted by, for example, voltage-dividing resistors, supplies the peak-hold circuit with the difference between the level-shift value of the non-inverted output and the inverted output. Therefore, it is possible to set the peak value of the first signal that is voltage-divided and inputted to the peak-hold circuit at a desired level. Consequently, since the voltage-dividing ratio of the voltage divider can be properly selected in accordance with the amount of level shift and the duty of an input-signal pulse, it becomes possible to set the peak value of the first signal at virtually the same level, that is, for example, at a level of 1:0.5 between the peak value of the input-signal pulse and the average value. This makes it possible to further minimize variations in the pulse width of a pulse that is obtained by shaping the input signal.

Moreover, the infrared data-transmitting apparatus is preferably provided with the waveform-shaping circuit having each of the above-mentioned arrangements, and the input signal is preferably given as a signal derived from infrared light that are spatially transferred and converted through photoelectric conversion.

In a commonly-used infrared data-transmitting apparatus, the pulse width after the waveform-shaping operation tends to fluctuate when the light-receiving level is altered by tailing at the time of a drop in the photocurrent of the light-receiving element. Further, in the case of spatial transmission, the light-receiving level varies extremely depending on transfer ranges, making the above-mentioned tendency more conspicuous.

In contrast, the above-mentioned arrangement makes it possible to exactly reproduce a transferred pulse waveform by selecting the threshold values as described above. Therefore, the present invention is preferably applicable to the infrared data communication, and makes it possible to widen the scope of the transfer speed and transfer range.

For a fuller understanding of the nature and advantages of the invention, reference should be made to the ensuing detailed description taken in conjunction with the accompanying drawings.

BRIEF DESCRIPTION OF THE DRAWINGS

FIGS. 8(a) through 8(e) are wave-form diagrams that explain the operation of the infrared data-receiving circuit shown in FIG. 7.

FIGS. 9(a) and 9(b) are drawings that show waveforms of the output electric current from a photodiode.

FIGS. 13(a) through 13(e) are wave-form diagrams that explain the operation of the infrared data-receiving circuit shown in FIG. 12.

DESCRIPTION OF THE EMBODIMENTS

Referring to FIGS. 1 through 3(c), the following description will discuss one embodiment of the present invention.

Figure 1:
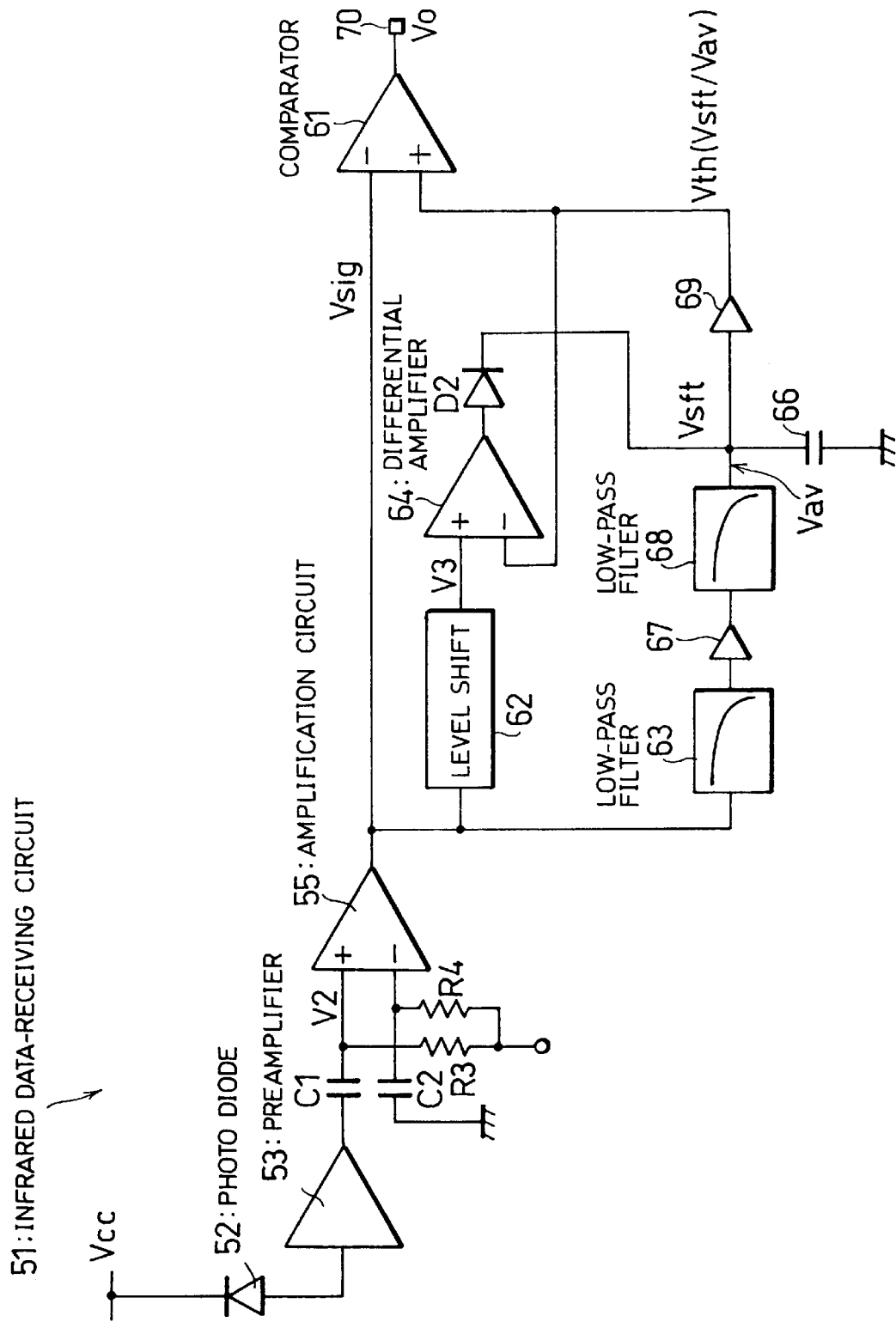
FIG. 1 is a block diagram showing a schematic construction of an infrared data-receiving circuit of one embodiment of the present invention.

FIG. 1 is a block diagram which schematically shows the construction of an infrared data-receiving circuit 51 of one embodiment of the present invention. The infrared data-receiving circuit 51 of this type is installed in an apparatus such as a portable information terminal, and used for receiving infrared data that matches the standard of IrDA (Infrared Data Association) 1.1.

A supply voltage Vcc is applied to the cathode side of a photodiode 52, and the photodiode 52 outputs a photocurrent corresponding to the intensity of infrared light that has been received from the anode to the preamplifier 53. The preamplifier 53 converts the photocurrent to a voltage, and the output is inputted to the non-inversion input terminal of an amplification circuit 55 through coupling capacitor C1. The inversion input terminal of the amplification circuit 55 is connected to ground through coupling capacitor C2, and the non-inversion input terminal and the inversion input terminal are respectively maintained at a predetermined dc-input level of the amplification circuit 55 by pull-up resistors R3 and R4.

A signal voltage Vsig from the amplification circuit 55 is directly inputted to the inversion input terminal of a comparator 61 for carrying out a waveform-shaping operation, and also inputted to a level-shift circuit 62 and low-pass filter 63 on the first stage. The level-shift circuit 62 reduces the signal voltage Vsig by a predetermined level V1, for example, 300 (mV), and supplies the shifted value V3 to the non-inversion input terminal of a differential amplifier 64. A threshold voltage Vth, which will be described later, is supplied to the inversion input terminal of the differential amplifier 64, and the differential amplifier 64 releases an output that corresponds to the difference between the shifted value V3 and the threshold voltage Vth to a capacitor 66 through a diode D2.

The output from the low-pass filter 63 is, on the other hand, supplied to the capacitor 66 through buffer 67 and low-pass filter 68 on the second stage. The capacitor 66, which constitutes a peak-hold circuit in combination with the differential amplifier 64 and the diode D2, functions as a holding capacitor, and also functions as an integrating capacitor for low-pass filter 68.

Therefore, the capacitor 66 outputs the higher of the two values, that is, the shifted value Vsft that is derived from the signal voltage Vsig and obtained through the level-shift circuit 62 and the differential amplifier 64 and the average value Vav obtained from low-pass filters 63 and 68, to the non-inversion input terminal of the comparator 61 and the inversion input terminal of the differential amplifier 64 through buffer 69 as the threshold voltage Vth. The comparator 61 outputs to the output terminal 70 an output signal Vo which goes low only within a period in which the signal voltage Vsig exceeds the threshold voltage Vth.

Figure 2:
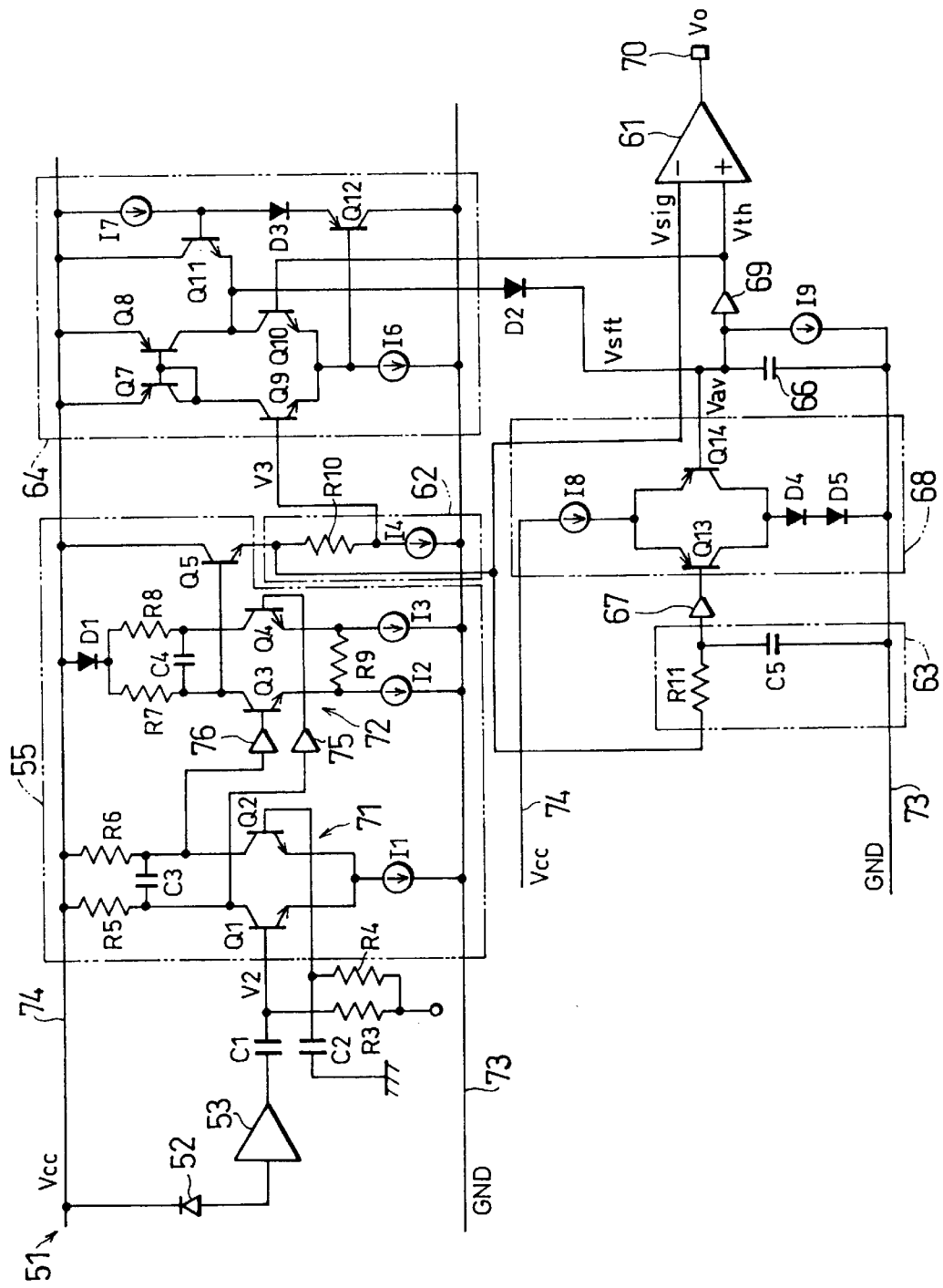
FIG. 2 is an electric-circuit diagram that shows the construction of the infrared data-receiving circuit of FIG. 1 more specifically.

FIG. 2 is an electric-circuit diagram which shows the construction of FIG. 1 more specifically. The amplification circuit 55 is mainly constituted by amplification circuit 71 at the first stage that is provided with transistors Q1 and Q2, amplification circuit 72 at the second stage that is provided with transistors Q3 and Q4, and output transistor Q5. The bases of transistors Q1 and Q2 are connected to the aforementioned coupling capacitors C1 and C2, the emitters thereof are connected to power-supply line 73 at the ground level through a common constant current supply I1, and the collectors thereof are connected to power-supply line 74 of the aforementioned supply voltage Vcc through resistors R5 and R6. Capacitor C3 is connected between the collectors of transistors Q1 and Q2. Therefore, as the input signal V2 from coupling capacitor C1 becomes higher, the collector electric potentials of transistors Q1 and Q2 decreases and increases respectively.

The collectors of transistors Q1 and Q2 are connected to the bases of transistors Q4 and Q3 through buffers 75 and 76 respectively. The emitters of transistors Q3 and Q4 are connected to the aforementioned power-supply line 73 through constant current supplies I2 and I3, and also connected to each other through resistor R9. Moreover, the collectors of transistors Q3 and Q4 are connected to power-supply line 74 through transistors R7 and R8 through diode D1, and also connected to each other through capacitor C4. The collector of transistor Q3 is connected to the base of transistor Q5, and the collector of transistor Q5 is connected to the above-mentioned power-supply line 74, and the emitter thereof is connected to the above-mentioned power-supply line 73 through a series circuit of resistor R10 and constant current source I4 that constitute a level shift circuit 62.

Therefore, when the collector electric potentials of transistors Q1 and Q2 decreases and increases, the emitter electric potential of the transistor Q5, which forms the signal voltage Vsig, increases. Thus, the amplification circuit 55 outputs the non-inversion amplified output of the input signal V2 as the signal voltage Vsig.

Moreover, a shift value V3 is inputted to the differential amplifier 64 from a connecting point between resistor R10 and constant current source I4. The above-mentioned shift value V3 is set at a value decreased by the level V1 (=R10×I4) from the above-mentioned signal voltage Vsig.

The differential amplifier 64 is mainly constituted by a pair of transistors Q7 and Q8 that constitute a current mirror circuit, input transistor Q9, and output transistors Q10 through Q12. The shift value V3 from the level shift circuit 62 is supplied to the base of transistor Q9, and the collector of transistor Q9 is connected to the collector and base of transistor Q7, and also connected to the base of transistor Q8. The emitters of transistors Q7 and Q8 are connected to the aforementioned power-supply line 74, and the collector of transistor Q8 is connected to the collector of transistor Q10 which forms a pair with the above-mentioned transistor Q9. The emitters of transistors Q9 and Q10 are connected to the aforementioned power-supply line 73 through constant current supply I6.

Moreover, a series circuit consisting of constant power supply I7, diode D3 and transistor Q12 is placed between the aforementioned power-supply lines 74 and 73. The connecting point between constant current supply I7 and diode D3 is connected to the base of transistor Q11, and the base of transistor Q12 is connected to a connecting point between the emitters Q9 and Q10 and constant current supply I6. The collector of transistor Q11 is connected to the aforementioned power supply line 74, and the emitter thereof is connected between the collectors of the aforementioned transistors Q8 and Q10. The aforementioned threshold voltage Vth is supplied to the base of transistor Q10.

Therefore, when the shift value V3 is not less than the threshold voltage Vth, the collector current of transistor Q9 increases, thereby decreasing the collector current of transistor Q10 and increasing the collector currents of transistors Q7 and Q8. Further, the emitter current of transistor Q11 also increases so that diode D2 is biased in the forward direction; thus, the capacitor 66 is charged up to the pulse peak value of the shift value V3 by the collector current of transistor Q8 and the emitter current of transistor Q11, thereby carrying out a holding operation.

In contrast, when the shift value V3 becomes smaller than the threshold voltage Vth, the collector currents of transistors Q9, Q7 and Q8 decrease, the collector current of transistor Q10 increases, and the collector voltage of transistor Q10 decreases. At this time, transistor Q10 is not saturated by the actions of transistors Q11 and Q12, diode D3 and constant current source I7. Consequently, the diode D2 is reversely biased so that the peak-holding operation enters a stand-by state.

The low-pass filter 63 is constituted by resistor R11 and capacitor C5 with a small capacity, and the output of the low-pass filter 63 with a low impedance is converted to have a high impedance by the buffer 67, and then inputted to the low-pass filter 68 at the next stage. The low-pass filter 68 has an arrangement wherein constant current supply I8, a parallel circuit of transistors Q13 and Q14, and diodes D4 and D5 are connected in series with one another between the aforementioned power-supply lines 74 and 73, and the output of the buffer 67 is inputted to the base of transistor Q13. Therefore, as the terminal voltage of capacitor C5 increases, the base current of transistor Q14 increases, and the base current is supplied to the capacitor 66.

Constant current supply I9 (bypass means), which is used for discharging, is connected in parallel with the capacitor 66. Therefore, the terminal voltage of the capacitor 66 takes the higher of the two values, that is, the average value Vav that is obtained by smoothing the output from the low-pass filter 68 by the capacitor 66 and the shift value Vsft that is obtained by holding the output of the differential amplifier 64. The terminal voltage is inputted to the non-inversion input terminal of the aforementioned comparator 61 as the threshold voltage Vth through the buffer 69.

Additionally, the value of electric current I9, supplied by the above-mentioned constant current supply I9, is defined in accordance with the discharging time of the capacitor 66. More specifically, when an input signal is supplied to the infrared data-receiving circuit 51, the peak-hold circuit, which is constituted by the differential amplifier 64, the capacitor 66, etc., increases the terminal voltage of the capacitor 66, that is, the threshold voltage Vth, and then, when the input signal is interrupted, the threshold voltage Vth decreases based upon a time constant that is calculated from the capacity of the capacitor 66 and the electric current value I9. In this case, when the discharging time is too long, there is a possibility that an input signal may be inputted before the threshold voltage Vth has dropped sufficiently. In such a case, the signal voltage Vsig cannot exceed the threshold voltage Vth, and consequently, the infrared data-receiving circuit 51 is not allowed to output the pulse. Therefore, more time is required until the next input signal has been inputted, with the result that the effective transfer speed drops. In contrast, if the charging time is too short, the threshold value tends to fluctuate. Therefore, the voltage value of constant current supply I9 is defined so that both the transfer speed and fluctuation are held within respective desired ranges. Additionally, in FIG. 1, the electric current supplied by the constant current supply I9 is, for example, given as the base current of the buffer 69, and set at approximately 10 (nA).

The capacitor 66 is set to have a capacity of, for example, 200 (pF), which is a sufficient capacity for use in the peak-holding and integrating operations and which can be built in an integrated circuit. The cutoff frequency of the low-pass filter 68 is set at approximately 1 (kHz). The low-pass filter 63 is installed in association with the response speeds of transistors Q13 and Q14 of the low-pass filter 68 at the next stage so as to allow transistors Q13 and Q14 to pass high frequencies; therefore, the capacity of capacitor C5 is only required to bypass the high frequencies so that it is set at a comparatively small capacity as described earlier.

Figure 3A:
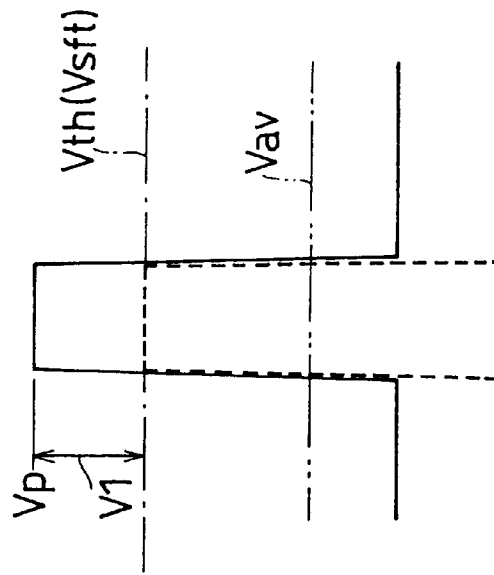
FIGS. 3(a) through 3(c) are wave-form diagrams that explain the operation of the infrared data-receiving circuit shown in FIGS. 1 and 2.
Figure 3B:
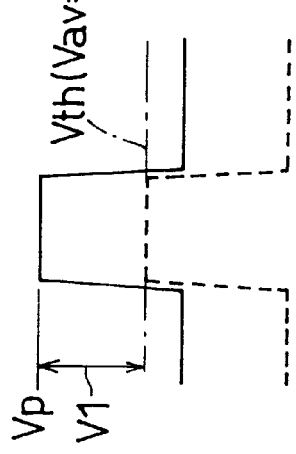
Figure 3C:
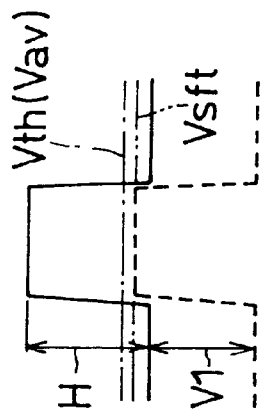

Therefore, in the infrared data-receiving circuit 51 arranged as described above, the operation waveforms of the respective parts are shown in FIGS. 3(a) through 3(c) in the same manner as FIGS. 13(a) through 13(f). In other words, at the time of long-range communication in which the signal voltage Vsig, indicated by a solid line, is comparatively low, the shift value V3 obtained from the level shift circuit 62 is set as indicated by a broken line in FIG. 3(a) so that the average value Vav obtained by the low-pass filter 68 is higher than the resulting shift value Vsft; therefore, the average value Vav is set as the threshold voltage Vth. Additionally, the average value Vav is equal to one-fourth of the pulse wave-height value H of the signal voltage Vsig in the aforementioned IrDA1.1 system.

Next, as the communication range becomes shorter causing the signal voltage Vsig to increase, the average value Vav and the shift value Vsft come to coincide with each other as shown in FIG. 3(b), and at the time of close-range communication in which the signal voltage Vsig is high, the shift voltage Vsft becomes higher than the average value Vav as shown in FIG. 3(c) so that the shift value Vsft is set as the threshold value Vth.

Figure 12:
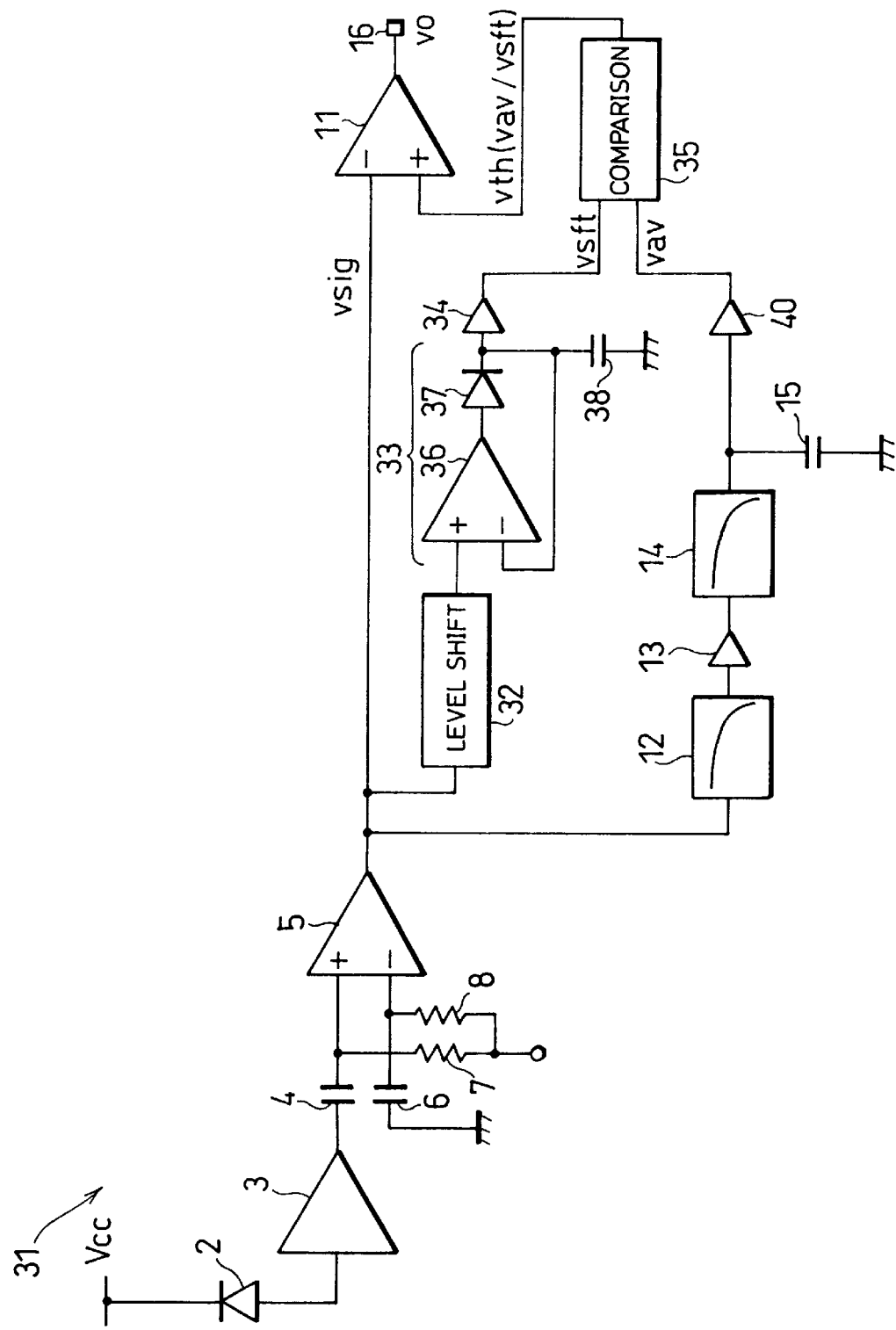
FIG. 12 is a block diagram that shows a schematic construction of still another prior-art infrared data-receiving circuit.

As described above, in the infrared data-receiving circuit 51 of the present invention, it is possible to switch the threshold voltage Vth between the average value Vav and the shift value Vsft in response to the light-receiving level of infrared light, and in order to reproduce the pulse width accurately, transistor Q14 at the output stage of the low-pass filter 68 and diode D2 at the output stage of the peak-hold circuit are arranged so that the higher of the two output voltages is applied to the capacitor 66. Further, constant current supply I9 is installed in parallel with the capacitor 66 so as to allow discharge, the capacitor is commonly used for the peak-holding operation and the integrating operation; this makes it possible to eliminate the capacitor 15 or 38 and the comparison circuit 35 from the infrared data-receiving circuit 31 as illustrated in FIG. 12. Consequently, it becomes possible to reduce the circuit scale and also to make the device suitable for use in integrated circuits.

The following arrangement is listed as a comparative example for shaping the pulse waveform by using another method: a transistor in the form of gyrator, which operates as a current-voltage converter, is installed at the front-end of the infrared data-receiving circuit and data information of the infrared data-receiving circuit is extracted from the gyrator output pulse that is shifted toward the negative side.

Here, for example, in the case when a modulated signal having comparatively slow transfer speeds is received as in the case of those based on IrDA 1.0 standard with transfer speeds in the range of 9600 bps to 115 kbps, the pulse that is shifted toward the negative side allow more accurate recognition of data contained therein even if they become wider than a pulse that is shifted toward the positive side and that is normally used. Therefore, the use of this arrangement makes it possible to accurately shape the waveform of input signal in the case when the transfer speed of the input signal is relatively slow.

However, in the case when a modulated signal which has fast transfer speeds and has a small permissible amount of pulse-width variation are used as the input signal, as in the case of those based on IrDA 1.1 standard with a transfer speed of approximately 4 Mbps, the pulse-width variation of the gyrator output that is shifted toward the negative side becomes extremely great between close-range communication and long-range communication. As a result, since the pulse-width variation exceeds the above-mentioned permissible amount, it is not possible to shape the waveform of input signal accurately.

In contrast, in the waveform-shaping circuit in accordance with the present embodiment, since the threshold value can be varied depending on the level of input signal, the pulse-width variation can be suppressed to a low level. Consequently, it becomes possible to shape the waveform of input signal accurately, even when the input signal have fast transfer speeds and also have a small permissible amount of pulse-width variation.

Referring to FIGS. 4 through 6(c), the following description will discuss another embodiment of the present invention.

Figure 4:
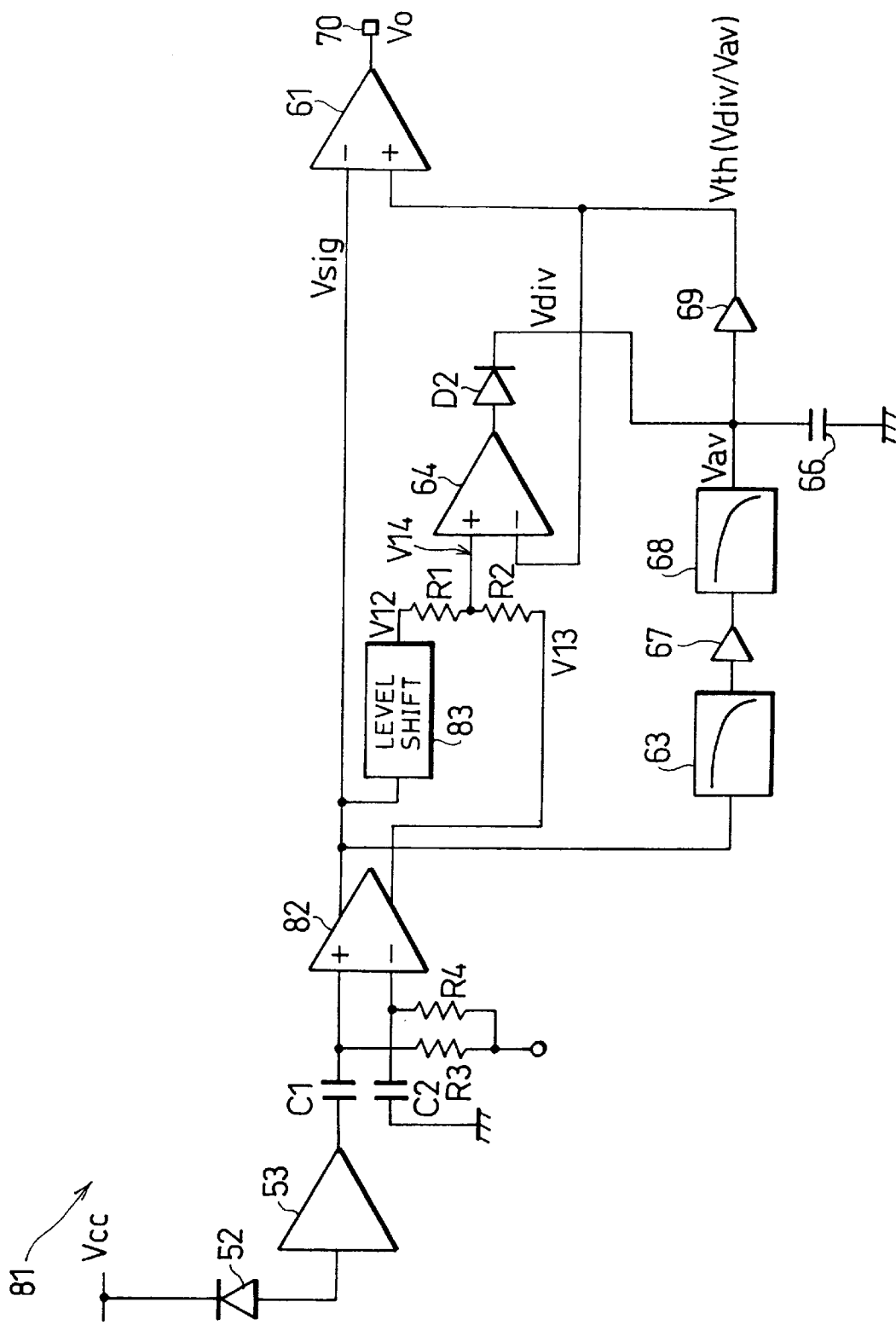
FIG. 4 is a block diagram that shows a schematic construction of an infrared data-receiving circuit of another embodiment of the present invention.
Figure 5:
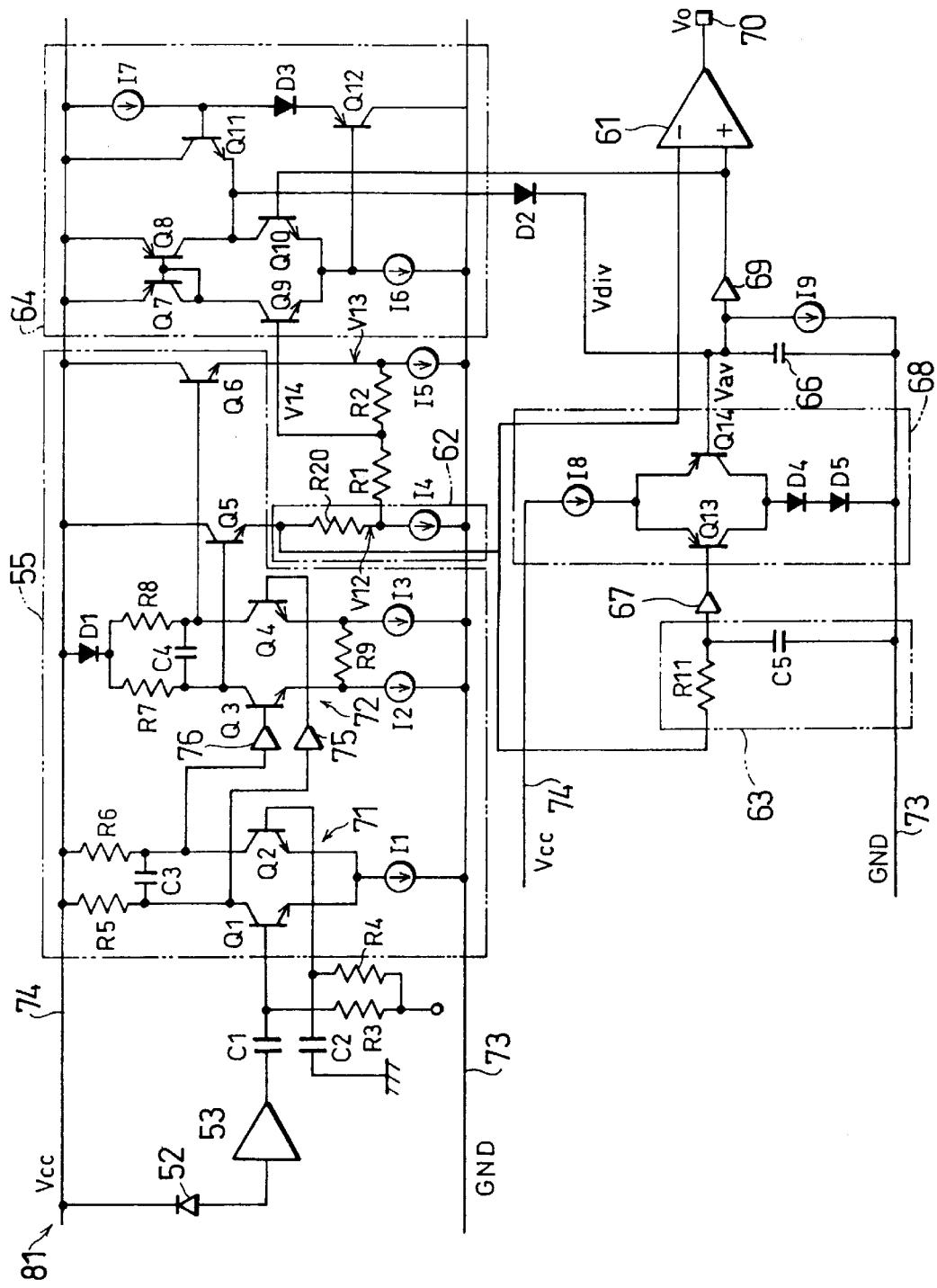
FIG. 5 is an electric-circuit diagram that shows the construction of the infrared data-receiving circuit of FIG. 4 more specifically.

FIG. 4 is a block diagram showing a schematic construction of an infrared data-receiving circuit 81 of another embodiment of the present invention; and FIG. 5 is an electric-circuit diagram showing a specific construction of the circuit of FIG. 4. Here, these constructions as shown in FIGS. 4 and 5 are similar to those shown in FIGS. 1 and 2; therefore, the corresponding parts are indicated by the same reference numerals, and the descriptions thereof are omitted.

This infrared data-receiving circuit 81 features that an amplification circuit 82, to which the output of a preamplifier 53 is supplied, is provided with an inversion output, and by using this, the electric-potential difference between the voltage V12, obtained by shifting the non-inverted signal voltage Vsig by the level V11 that has been predetermined in the level shift circuit 83, and the voltage V13 of the inversion output is voltage-divided by resistors R1 and R2 and then inputted to a differential amplifier 64. In other words, as shown in FIG. 5, resistor R20 in the level shift circuit 83 is set at one-third of the aforementioned resistor R10; thus, the aforementioned level V11 is set at R20×I4=100 (mV).

Further, transistor Q6 is installed in the amplification circuit 82, and in contrast to the aforementioned transistor Q5 whose base is connected to the collector side of transistor Q3 so as to release an non-inversion input, this transistor Q6 has its base connected to the collector side of transistor Q4 so as to release an inversion output. The collector of transistor Q6 is connected to the aforementioned power-supply line 74, and the emitter thereof is connected to power-supply line 73 through constant current supply I5. Moreover, to the base of transistor Q9 of the differential amplifier 64 is inputted the difference between an electric potential at the connecting point of resistor R20 and constant current supply I4 and the emitter electric potential of the aforementioned transistor Q6, with being voltage-divided by resistors R1 and R2 to, for example, a ratio of 1:2.

Figure 6C:
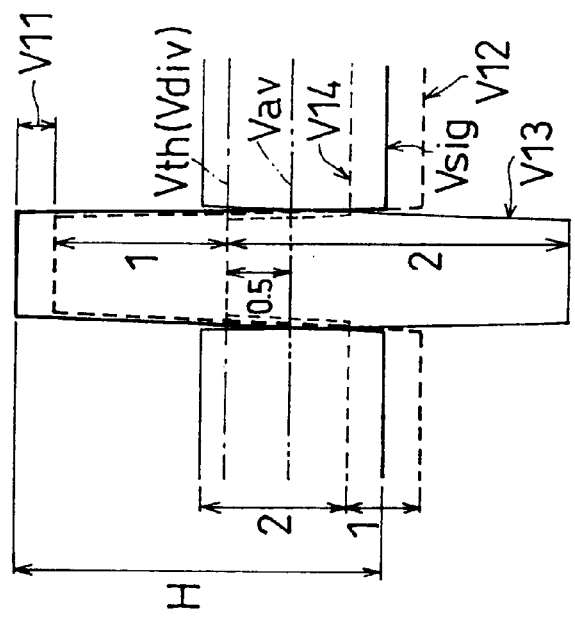
FIGS. 6(a) through 6(c) are wave-form diagrams that explain the operation of the infrared data-receiving circuit shown in FIGS. 4 and 5.
Figure 6B:
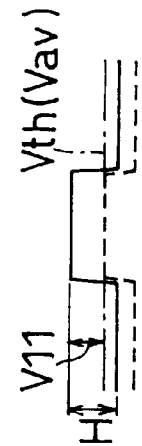
Figure 6A:
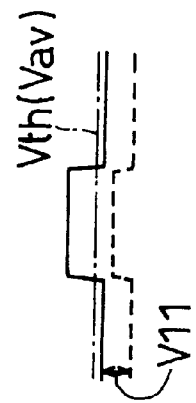
Figure 7:
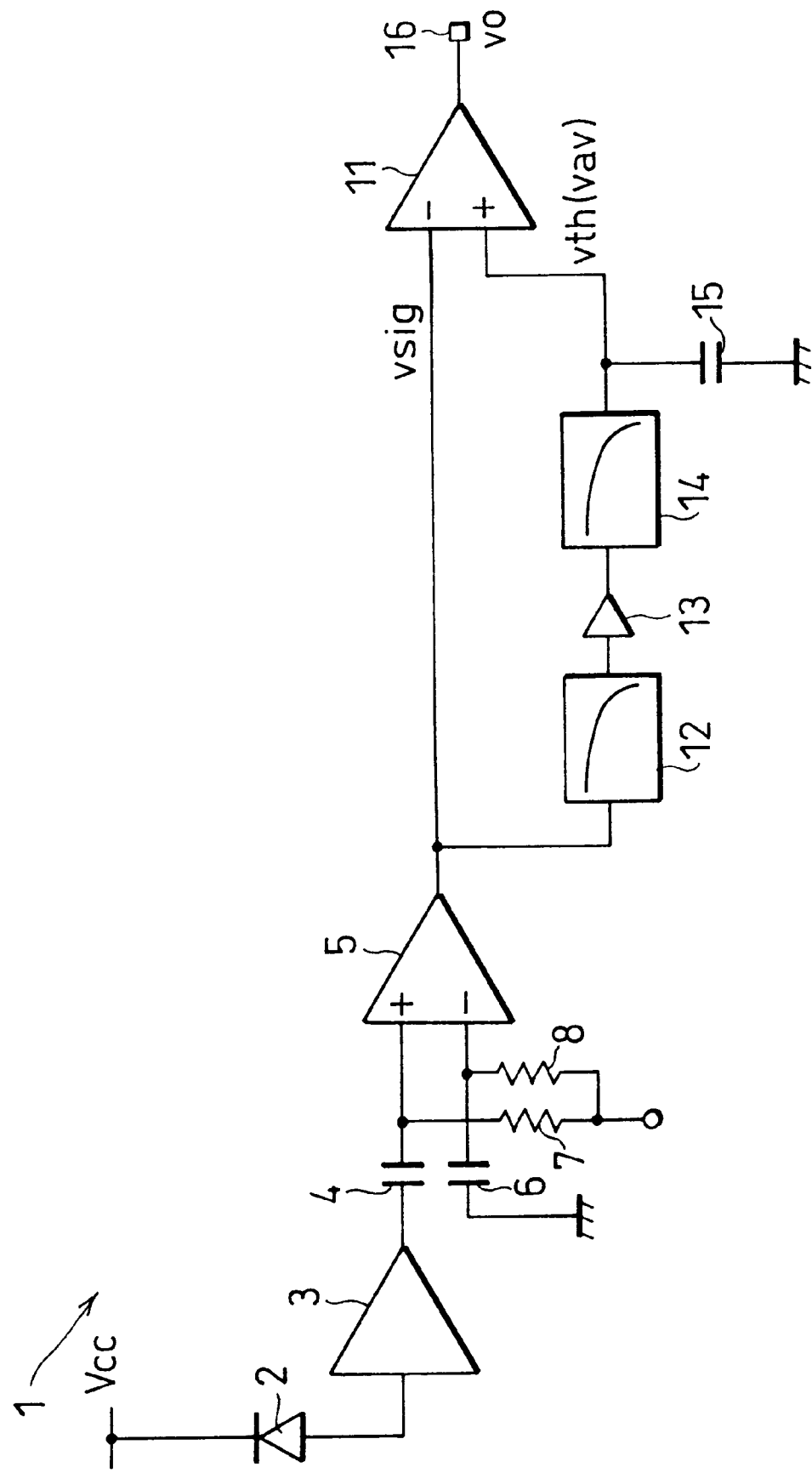
FIG. 7 is a block diagram that shows a schematic construction of a typical prior-art infrared data-receiving circuit.
Figure 10:
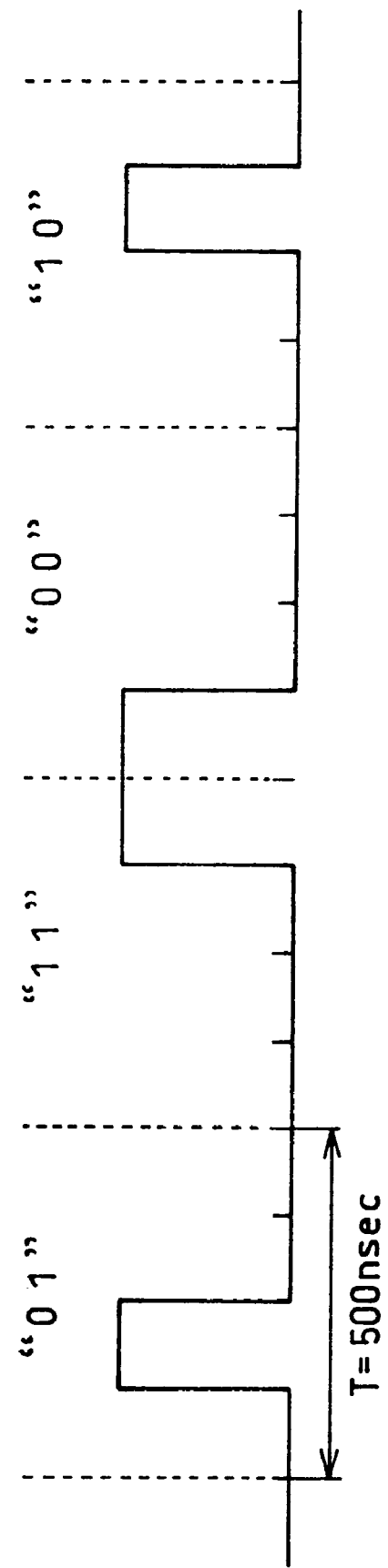
FIG. 10 is a drawing which explains a modulated waveform by the IrDA1.1 system.
Figure 11:
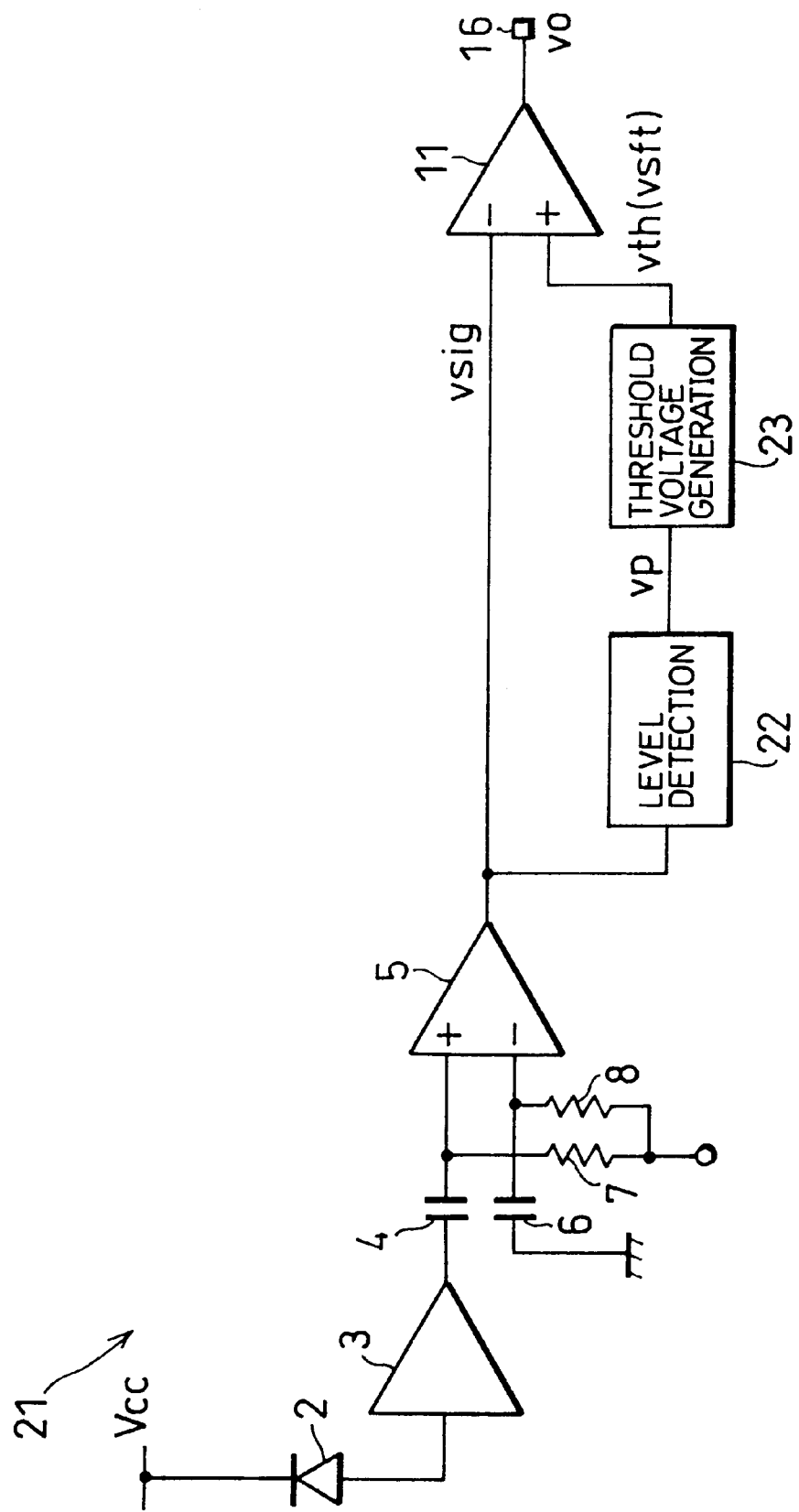
FIG. 11 is a block diagram that shows a schematic construction of another prior-art infrared data-receiving circuit.

Therefore, at the time of long-range communication, as shown in FIG. 6(a), the peak value of the output voltage V12 of the level shift circuit 83, indicated by a broken line, is low, that is, not more than the average value Vav as compared with the signal voltage Vsig indicated by a solid line; therefore, the threshold voltage Vth is set at the average value Vav.

During the time in which the communication range becomes smaller as shown in FIG. 6(b) until the wave-height value H of the signal voltage Vsig satisfies the following relationship, the average value Vav is continuously used as the threshold value Vth.

$$3H/4 = V11 = 100 \text{ (mV)} \tag{2}$$

When the communication range further becomes smaller so that the wave-height value H of the signal voltage Vsig becomes greater than the relationship as shown by the above-mentioned equation (2), the output voltage V12 of the level shift circuit 83 becomes a state as indicated by the broken line with respect to the signal voltage Vsig indicated by the solid line, as shown in FIG. 6(c), while the inversion output of the amplification circuit 82 becomes a state as indicated by reference number V13; thus, the input voltage of the differential voltage 64 becomes a state as indicated by reference number V14.

As described above, in the case when the pulse peak value of the input voltage V14 to the differential amplifier 64 is greater than the average value Vav of the pulse of the signal voltage Vsig, the threshold voltage Vth is set at a voltage Vdiv that is obtained by voltage-dividing the output voltage V12 of the level shift circuit 83 and the inversion output V13 of the amplification circuit 82 by resistors R1 and R2; therefore, by setting the desired tap voltage ratio defined by the above-mentioned voltage-dividing resistors R1 and R2 at, for example, R1:R2=1:2, the threshold voltage Vth is set with a ratio of approximately 1:0.5 between the peak value of the signal voltage Vsig and the average value. Consequently, in particular, at the time of intermediate-range communication, it becomes possible to further minimize the variation of the pulse width of the output signal Vo from the comparator 61.

Additionally, in the above-mentioned embodiments, explanations were made by exemplifying cases in which the amounts of shift V1 and V11 of the level shift circuits 62 and 83 were respectively set at 300 (mV) and 100 (mV); however, the amount of shift is not intended to be limited these values, and can be preferably set depending on purposes. More specifically, in the output signal Vo of the infrared data-receiving circuit 51, when a permissible range of variation in the pulse width is determined, the range of the threshold voltage Vth in response to the signal voltage Vsig can be calculated by the characteristics of the photodiode 52. Therefore, the amount of shift can be set so that the threshold voltage Vth is placed within the corresponding range. Moreover, the pulse width which is to be obtained after the waveform-shaping process can be controlled to a certain degree by adjusting the amount of shift.

The first waveform-shaping circuit of the present invention, wherein an input signal is level-discriminated so as to shape the waveform thereof by using the higher of the two values, that is, a first threshold value that is set as a value lower than the peak value of the input signal by a predetermined value and a second threshold value that is set as the average of the input signal, is characterized in that a single capacitor is commonly used as a holding-use capacitor in a peak-hold circuit for finding the peak value and as an integrating-use capacitor in an average-value calculating circuit for finding the average and in that the output stages to the capacitor in the peak-hold circuit and the average-value calculating circuit are allowed to provide currents to the capacitor only in one direction and a constant current supply, which provides a current in the other direction with respect to the capacitor, is installed in parallel with the capacitor.

With the above-mentioned arrangement, the output stages in the peak-hold circuit and the average-value calculating circuit are constituted by elements such as diodes and transistors that supply currents only in one direction so as to charge the capacitor, and the constant current supply, which is installed in parallel with the capacitor, is used for discharge; thus, the terminal voltage of the capacitor, which is used for carry out the peak-holding operation and the average-value calculating operation, is set at the higher of the two values, that is, the peak value and the average value.

Therefore, in the arrangement which uses two threshold values selectively so as to reproduce a waveform with an accurate pulse width in response to a pulse input having a great level difference, a single capacitor can be commonly used as the holding-use capacitor for the peak-hold circuit and as the integrating-use capacitor for the average-value calculating circuit so that a capacitor, which is a large part, and a comparison circuit for the two threshold values can be eliminated so as to simplify the construction.

Moreover, in addition to the arrangement of the first waveform-shaping circuit, the second waveform-shaping circuit of the present invention is characterized in that: the amplification circuit for amplifying the input signal generates an inversion output and an inversion output; the level shift circuit, which finds a value that is lower by the above-mentioned predetermined value, shifts the level of the non-inversion output; and the difference between the output from the level shift circuit and the inversion output is voltage-divided by a voltage-dividing resistor so as to provide an input to the peak-hold circuit.

In the above-mentioned arrangement, the amplification circuit is constituted by an differential amplifier or other device so as to output an inversion output and a non-inversion output, and the difference between the level-shifted value of the non-inversion output and the inversion output is voltage-divided, and supplied to the peak-hold circuit.

Therefore, the peak value, which is voltage-divided and supplied to the peak-hold circuit, is set at a desired level so that the first threshold value is set at virtually the same level, for example, at a level of 1:0.5 between the peak value and the average value of the pulse, by properly selecting the ratio of the voltage-dividing resistors depending on the amount of the level shift and the pulse duty of the input signal; thus, it becomes possible to further minimize the variation in the pulse width of a pulse obtained through the shaping operation.

Moreover, the first infrared data transmitting apparatus of the present invention is characterized in that it is provided with the first or the second waveform-shaping circuit, and in that the input signal is a signal derived from infrared light that are spatially transmitted and converted by a photoelectric transfer element.

In a commonly-used infrared data-transmitting apparatus, the pulse width after the waveform-shaping operation tends to fluctuate when the light-receiving level is altered by tailing at the time of a drop in the photocurrent of the light-receiving element. Further, in the case of spatial transmission, the light-receiving level varies extremely depending on transfer ranges, making the above-mentioned tendency more conspicuous.

In contrast, the above-mentioned arrangement makes it possible to exactly reproduce a transferred pulse waveform by selecting the threshold values as described above. Therefore, the present invention is preferably applicable to the infrared data communication, and makes it possible to widen the scope of the transfer speed and transfer range.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A waveform-shaping circuit, which level-discriminates an input signal so as to carry out a waveform-shaping operation by using the higher of the two values, that is, a first threshold value that is selected as a peak value of a first signal that varies in response to the input signal and a second threshold value that is selected as the average of the input signal, comprising:

a peak-hold circuit for finding the peak value of the first signal;

an average-value calculating circuit for finding the average of the input signal; and a capacitor that is commonly used for a holding operation in the peak-hold circuit as well as for an integrating operation in the average-value calculation circuit, wherein: the direction of currents to be supplied to the capacitor from the peak-hold circuit and the average-value calculating circuit is limited only to a first direction and the waveform-shaping circuit is further provided with a bypass means, installed in parallel with the capacitor, for allowing current to flow in a direction reversed to the first direction.

2. The waveform-shaping circuit as defined in claim 1, further comprising:

a level shift circuit for reducing the level of the input signal by a predetermined value and for outputting the resulting signal to the peak-hold circuit as the first signal.

3. The waveform-shaping circuit as defined in claim 1, further comprising:

an amplifier for amplifying the input signal so as to generate an inversion output and a non-inversion output;

a level-shift circuit for reducing the non-inversion output by a predetermined value; and a voltage-dividing circuit for voltage-dividing the difference between the output of the level-shift circuit and the inversion output by a predetermined ratio and for outputting the resulting voltage to the peak-hold circuit as the first signal.

4. The waveform-shaping circuit as defined in claim 1, wherein the peak-hold circuit comprises a comparator which supplies an electric current in the first direction when the value of the first signal is higher than the output of the peak-hold circuit.

5. The waveform-shaping circuit as defined in claim 4, wherein the comparator comprises:

a differential amplifier having a non-inversion input terminal to which the first signal is applied and an inversion input terminal to which the output terminal of the capacitor is connected; and a first rectifier that is installed between the differential amplifier and the output terminal of the capacitor.

6. The waveform-shaping circuit as defined in claim 1, wherein the peak-hold circuit, the average-value calculating circuit, the capacitor and bypass means are integrated onto an integrated circuit.

7. The waveform-shaping circuit as defined in claim 1, wherein the average-value calculating circuit comprises:

a second rectifier for limiting an electric current to be supplied to the capacitor to the first direction; and a low-pass filter whose cutoff frequency is set not more than a frequency to which the second rectifier is allowed to respond, the low-pass filter being placed between the input terminal of the input signal and the second rectifier.

8. An infrared data-transmitting apparatus for receiving data through infrared light that is spatially transmitted, comprising:

a photoelectric transfer element for converting the spatially transmitted infrared light into an electric signal; and a waveform-shaping circuit, which level-discriminates the input signal so as to carry out a waveform-shaping operation by using the higher of the two values, that is, a first threshold value that is selected as a peak value of a first signal that varies in response to the input signal derived from the electric signal and a second threshold value that is selected as the average of the input signal, comprising:

a peak-hold circuit for finding the peak value of the first signal;

an average-value calculating circuit for finding the average of the input signal; and a capacitor that is commonly used for a holding operation in the peak-hold circuit as well as for an integrating operation in the average-value calculation circuit, wherein: the direction of currents to be supplied to the capacitor from the peak-hold circuit and the average-value calculating circuit is limited only to a first direction and the waveform-shaping circuit is further provided with a bypass means, installed in parallel with the capacitor, for allowing current to flow in a direction reversed to the first direction.

9. The infrared data-transmitting apparatus as defined in claim 8, wherein the waveform-shaping circuit further comprises:

an amplifier for amplifying the input signal so as to generate an inversion output and a non-inversion output;

a level-shift circuit for reducing the non-inversion output by a predetermined value; and a voltage-dividing circuit for voltage-dividing the difference between the output of the level-shift circuit and the inversion output by a predetermined ratio and for outputting the resulting voltage to the peak-hold circuit as the first signal.

* * * * *